(12) United States Patent
Hodono

(10) Patent No.: US 7,995,881 B2
(45) Date of Patent: Aug. 9, 2011

(54) OPTO-ELECTRIC HYBRID MODULE AND MANUFACTURING METHOD THEREOF

(75) Inventor: Masayuki Hodono, Ibaraki (JP)

(73) Assignee: Nitto Denko Corporation, Ibaraki-Shi, Osaka (JP)

( * ) Notice: Subject to any disclaimer, the term of this patent is extended or adjusted under 35 U.S.C. 154(b) by 0 days.

(21) Appl. No.: 12/472,768

(22) Filed: May 27, 2009

(65) Prior Publication Data

US 2009/0297096 A1 Dec. 3, 2009

Related U.S. Application Data

(60) Provisional application No. 61/060,920, filed on Jun. 12, 2008.

(30) Foreign Application Priority Data

May 27, 2008 (JP) .................................. 2008-138492

(51) Int. Cl.
*G02B 6/26* (2006.01)

(52) U.S. Cl. .......................................... 385/18; 385/14

(58) Field of Classification Search ..................... 385/14, 385/18
See application file for complete search history.

(56) References Cited

U.S. PATENT DOCUMENTS

| | | | | |
|---|---|---|---|---|
| 6,236,786 B1* | 5/2001 | Aoki et al. | .................... | 385/50 |
| 7,466,880 B2* | 12/2008 | Windover | ....................... | 385/14 |
| 7,603,005 B2* | 10/2009 | Shioda | ............................. | 385/14 |
| 7,627,204 B1* | 12/2009 | Deane | ............................. | 385/14 |
| 2002/0051599 A1* | 5/2002 | Tsukamoto et al. | ........... | 385/14 |
| 2008/0317402 A1* | 12/2008 | Kodama et al. | ................ | 385/14 |

FOREIGN PATENT DOCUMENTS

JP 2004-302345 A 10/2004

* cited by examiner

*Primary Examiner* — Charlie Peng
(74) *Attorney, Agent, or Firm* — Westerman, Hattori, Daniels & Adrian, LLP

(57) ABSTRACT

An opto-electric hybrid module capable of reducing the propagation loss of light beams, and a manufacturing method thereof. An opto-electric hybrid module in which a light-emitting element and a light-receiving element are mounted on the front surface side of an electric circuit board E, and an optical waveguide $W_1$ is bonded to the back surface side thereof. The optical waveguide $W_1$ includes a core having opposite end portions formed as light reflection portions. Portions of the core near the opposite end portions are formed as extensions extending from the light reflection portions toward the light-emitting element and the light-receiving element. The extensions and are positioned in through holes for light propagation formed in the electric circuit board E, and have distal end surfaces and in face-to-face relationship with a light-emitting portion of the light-emitting element and a light-receiving portion of the light-receiving element, respectively.

3 Claims, 7 Drawing Sheets

F I G. 4 A
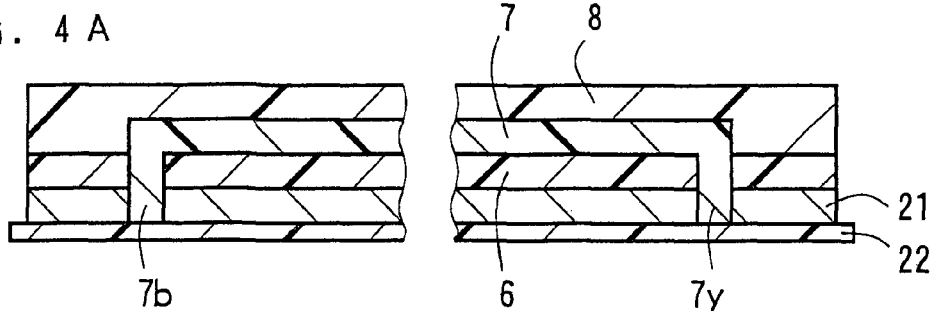
F I G. 4 B
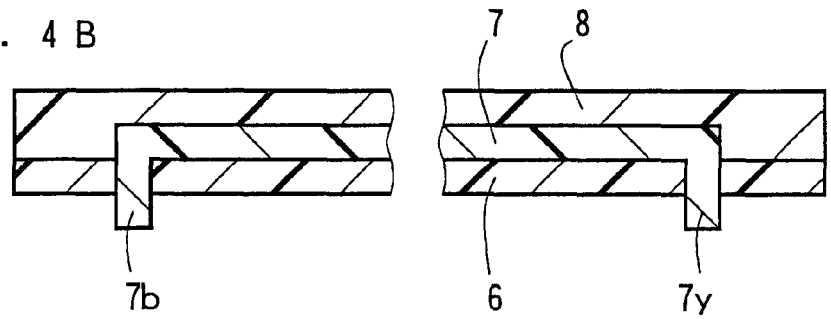
F I G. 4 C
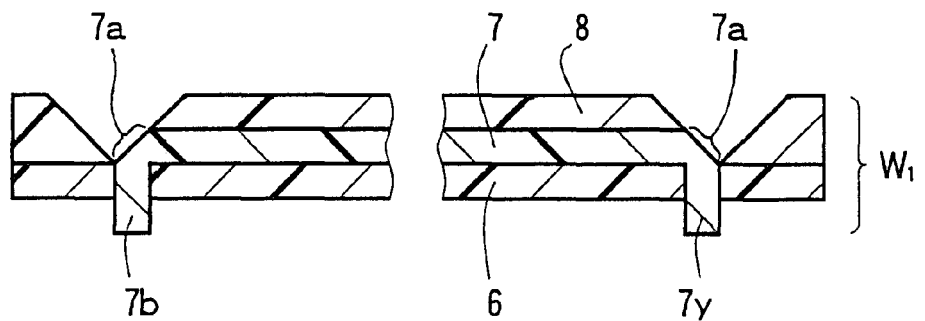

F I G. 9
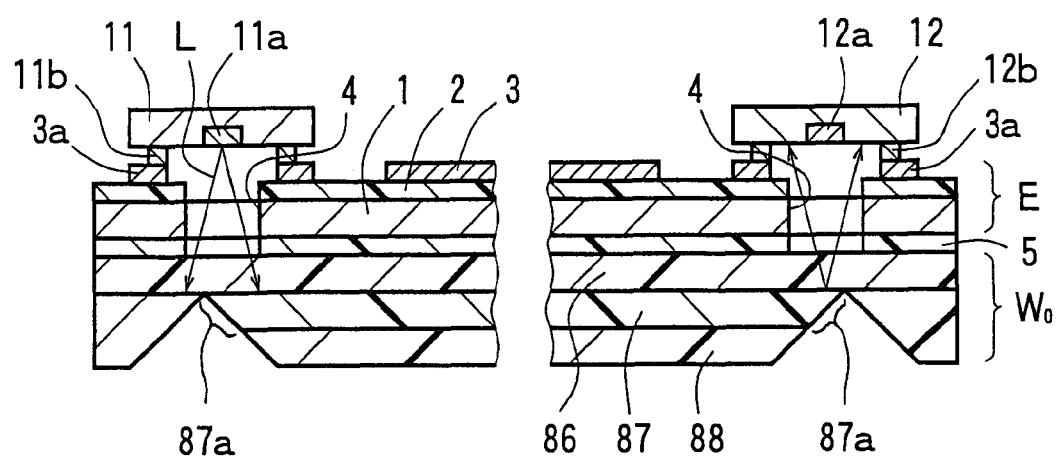
PRIOR ART

OPTO-ELECTRIC HYBRID MODULE AND MANUFACTURING METHOD THEREOF

RELATED APPLICATIONS

This application claims the benefit of U.S. Provisional Application No. 61/060,920, filed Jun. 12, 2008, which is hereby incorporated by reference.

BACKGROUND OF THE INVENTION

1. Field of the Invention

The present invention relates to an opto-electric hybrid module in which an optical waveguide and an electric circuit with an optical element mounted thereon are combined, and to a manufacturing method thereof.

2. Description of the Related Art

An opto-electric hybrid module is manufactured, for example, as shown in FIG. 9, by preparing an electric circuit board E and an optical waveguide $W_0$ individually, bonding both to each other with an adhesive 5, and then mounting a light-emitting element 11 and a light-receiving element 12 on portions of the above-mentioned electric circuit board E corresponding to opposite end portions of the above-mentioned optical waveguide $W_0$ (see, for example, Japanese Patent Application Laid-Open No. 2004-302345).

The above-mentioned electric circuit board E is constructed such that an electric circuit 3 is formed on the surface of a stainless steel substrate 1, with an insulation layer 2 therebetween. Portions of this electric circuit 3 serve as mounting pads 3a for mounting the above-mentioned light-emitting element 11 and light-receiving element 12 thereon. The above-mentioned optical waveguide $W_0$ is constructed such that an under cladding layer 86, a core 87, and an over cladding layer 88 are formed in the order named from the back side of the above-mentioned stainless steel substrate 1. Further, V-shaped notches are formed in portions near the opposite ends of the above-mentioned optical waveguide $W_0$. One side surface of the V-shape is formed as an inclined surface inclined at 45 degrees to the above-mentioned electric circuit board E, and an end portion of the core 87 positioned at the inclined surface serves as an optical path conversion mirror 87a. In this opto-electric hybrid module, the above-mentioned electric circuit board E has a through hole 4 for light propagation formed on the light-emitting element 11 side thereof so as to enable light beams (an optical signal) L emitted from the light-emitting element 11 to enter the end portion of the core 87 on the light-emitting element 11 side. Also, the above-mentioned electric circuit board E further has a through hole 4 for light propagation formed on the light-receiving element 12 side thereof so as to enable the light-receiving element 12 to receive the light beams L emitted from the light-emitting element 11 and coming through the core 87 of the optical waveguide $W_0$ to the optical path conversion mirror 87a on the light-receiving element 12 side. In FIG. 9, the reference character 11a designates a light-emitting portion of the above-mentioned light-emitting element 11, and the reference character 11b designates a bump (electrode) of the light-emitting element 11. Also, the reference character 12a designates a light-receiving portion of the above-mentioned light-receiving element 12, and the reference character 12b designates a bump (electrode) of the light-receiving element 12.

The propagation of the light beams L in the above-mentioned opto-electric hybrid module is accomplished in a manner to be described below. First, the light beams L are emitted downwardly from the light-emitting portion 11a of the light-emitting element 11. The light beams L pass through the through hole 4 for light propagation of the electric circuit board E and then through the under cladding layer 86 in a first end portion (a left-hand end portion in FIG. 9) of the optical waveguide $W_0$, and enter a first end portion of the core 87. Subsequently, the light beams L are reflected from the optical path conversion mirror 87a provided in the first end portion of the core 87 (or the optical path is changed by 90 degrees), and travel through the interior of the core 87 in an axial direction. Then, the light beams L travel through the interior of the core 87 and a repropagated to a second end portion (a right-hand end portion in FIG. 9) of the core 87. Subsequently, the light beams L are reflected upwardly from the optical path conversion mirror 87a provided in the above-mentioned second end portion (or the optical path is changed by 90 degrees), pass through and exit from the under cladding layer 86, and are received by the light-receiving portion 12a of the light-receiving element 12.

However, the light beams L emitted from the light-emitting portion 11a of the above-mentioned light-emitting element 11 are diffused, as shown in FIG. 9. Thus, if the distance between the light-emitting element 11 and the optical path conversion mirror 87a provided in the first end portion of the core 87 is long, the light beams L deviate from the optical path conversion mirror 87a and are not guided into the core 87 in some instances. Similarly, the light beams L reflected from the optical path conversion mirror 87a provided in the second end portion of the core 87 are also diffused. Thus, the light beams L deviate from the light-receiving portion 12a of the light-receiving element 12 and are not received by the light-receiving portion 12a in some instances. For these reasons, there is a problem with the prior art opto-electric hybrid module in that the propagation loss of the light beams L is increased.

During the mounting of the light-emitting element 11 and the light-receiving element 12 in the manufacture of the above-mentioned opto-electric hybrid module, the positions of the optical path conversion mirrors 87a provided in the opposite end portions of the core 87 are in general recognized through the through holes 4 for light propagation formed in the above-mentioned electric circuit board E by using an image recognition apparatus and the like, whereby the mounting positions are identified. To this end, it is necessary that the optical waveguide $W_0$ is already formed during the mounting of the above-mentioned light-emitting element 11 and the like. On the other hand, during the mounting of the above-mentioned light-emitting element 11 and the like, the bump 11b thereof is heated to melt (at approximately 230 to 250° C.), and is then connected to the mounting pads 3a of the electric circuit 3. For this reason, the heating during the mounting of the above-mentioned light-emitting element 11 and the like causes thermal stresses to act on the optical waveguide $W_0$, thereby distorting the optical waveguide $W_0$. As a result, this decreases the accuracy of alignment (positioning) of the light-emitting element 11 and the like with (relative to) the optical path conversion mirrors 87a provided in the opposite end portions of the core 87 to result in the increase in the propagation loss of the light beams L.

DISCLOSURE OF THE INVENTION

In view of the foregoing, it is an object of the present invention to provide an opto-electric hybrid module capable of reducing the propagation loss of light beams, and a manufacturing method thereof.

To accomplish the above-mentioned object, a first aspect of the present invention is intended for an opto-electric hybrid module comprising: an electric circuit board, an optical element mounted on a first surface of the electric circuit board, the first surface being a surface with an electric circuit formed thereon, and an optical waveguide formed in a stacked manner on a second surface of the electric circuit board opposite from the first surface thereof, said optical waveguide including an under cladding layer formed on the second surface of the electric circuit board, and a core formed on the under cladding layer, said core including an end portion formed with a reflection portion for reflecting light beams to allow the light beams to propagate between said core and said optical element, said optical element being positioned in a portion of the first surface of said electric circuit board corresponding to the end portion of said core, said electric circuit board including a through hole for light propagation lying between said core and said optical element and formed in a portion of said electric circuit board corresponding to said optical element, the end portion of said core extending from said reflection portion toward said optical element to form an extension, said extension being positioned in said through hole for light propagation, said extension having a distal end surface in face-to-face relationship with a light-receiving and light-emitting portion of said optical element.

A second aspect of the present invention is intended for a method of manufacturing an opto-electric hybrid module, comprising the steps of: producing an electric circuit board including a through hole for light propagation formed in a predetermined region thereof; producing an optical waveguide including an under cladding layer, and a core having a reflection portion and an extension; mounting an optical element on said electric circuit board, with the optical element in-face-to-face relationship with the predetermined region of said electric circuit board; and bonding the under cladding layer of said optical waveguide to a surface of said electric circuit board opposite from a surface with an electric circuit formed thereon, with the extension of the core of said optical waveguide positioned in said through hole of said electric circuit board, after the mounting of said optical element.

In the opto-electric hybrid module according to the present invention, the portion of the core near the end portion thereof extends from the reflection portion toward the optical element, and the extension is positioned in the through hole for light propagation. The distal end surface of the extension is in face-to-face relationship with the light-receiving and light-emitting portion of the above-mentioned optical element. Thus, the distance between the distal end surface of the extension of the core and the optical element is shortened. For example, when the above-mentioned optical element is a light-emitting element, this allows light beams emitted from the light-emitting portion of the above-mentioned light-emitting element to enter the distal end surface of the extension of the above-mentioned core before the light beams are diffused too widely. Further, the light beams are guided through the interior of the extension of the above-mentioned core to the reflection portion of the core with reliability. Then, the light beams are reflected from the above-mentioned reflection portion to travel further into the depth of the core. Similarly, when the light beams exit from the distal end surface of the extension of the above-mentioned core (or when the above-mentioned optical element is a light-receiving element), the light beams traveling from the depth of the core to the reflection portion of the core are reflected from the reflection portion, and thereafter are guided through the interior of the extension of the above-mentioned core to the distal end surface thereof with reliability. Then, the light-receiving portion of the light-receiving element can receive the light beams exiting from the distal end surface thereof before the light beams are diffused too widely. In this manner, the opto-electric hybrid module according to the present invention, in which the reliability of the light propagation is improved, is capable of reducing the propagation loss of the light beams.

Also, in the manufacturing method of the opto-electric hybrid module according to the present invention, the portion of the core of the optical waveguide near the end portion thereof is formed as the extension extending from the reflection portion toward the optical element. Thus, the distance between the distal end surface of the extension and the optical element is shortened. This reduces the propagation loss of the light beams. For this reason, sufficient efficiency of propagation of the light beams is obtained by mounting the optical element in face-to-face relationship with the above-mentioned region in which the through hole is formed, rather than by mounting the optical element while the distal end surface of the extension of the above-mentioned core is recognized through the above-mentioned through hole. This enables the above-mentioned optical waveguide to be bonded to the surface of the above-mentioned electric circuit board opposite from the surface with the electric circuit formed thereon after the mounting of the optical element on the surface of the above-mentioned electric circuit board with the electric circuit formed thereon. In this manner, the manufacturing method of the opto-electric hybrid module according to the present invention, in which the above-mentioned optical waveguide is bonded to the above-mentioned electric circuit board after the step of mounting the above-mentioned optical element which requires heating, eliminates the adverse effect of the above-mentioned heating on the optical waveguide.

BRIEF DESCRIPTION OF DRAWINGS

FIGS. 4(a) to (c) are illustrations schematically showing the subsequent steps of producing the above-mentioned optical waveguide.

FIG. 9 is a sectional view schematically showing a conventional opto-electric hybrid module.

DETAILED DESCRIPTION

Next, embodiments according to the present invention will now be described in detail with reference to the drawings.

Figure 1:
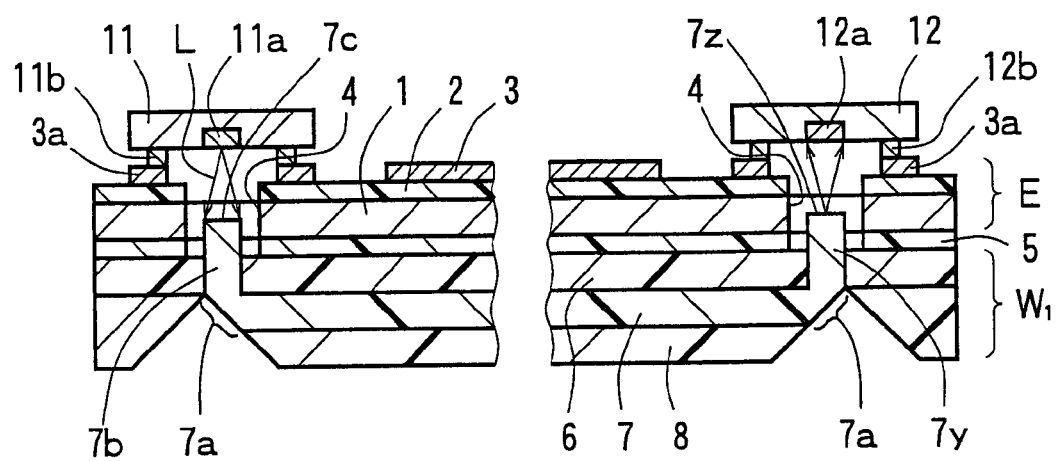
FIG. 1 is a sectional view schematically showing an opto-electric hybrid module according to a first embodiment of the present invention.

FIG. 1 shows an opto-electric hybrid module according to a first embodiment of the present invention. This opto-electric hybrid module includes: an electric circuit board E with an electric circuit 3 formed on the surface thereof; a light-emitting element 11 and a light-receiving element 12 both mounted on a first surface of the electric circuit board E on which the electric circuit 3 is formed; and an optical waveguide $W_1$ bonded with an adhesive 5 to a second surface (or a back surface) of the above-mentioned electric circuit board E opposite from the first surface (or a front surface). The above-mentioned optical waveguide $W_1$ is constructed such that an under cladding layer 6, a core 7, and an over cladding layer 8 are formed in the order named from the back surface side of the above-mentioned electric circuit board E. V-shaped notches are formed in portions near the opposite ends of this optical waveguide $W_1$. One side surface of the V-shape is formed as an inclined surface inclined at 45 degrees to the above-mentioned electric circuit board E. An end portion of the core 7 positioned at the inclined surface serves as a light reflection portion 7a. The above-mentioned light-emitting element 11 is positioned in corresponding relation to the light reflection portion 7a provided in a first end portion of the above-mentioned core 7, and the above-mentioned light-receiving element 12 is positioned in corresponding relation to the light reflection portion 7a provided in a second end portion of the above-mentioned core 7. Further, through holes 4 for light propagation are formed in portions of the electric circuit board E corresponding to the above-mentioned light-emitting element 11 and light-receiving element 12.

A portion of the above-mentioned core 7 near the endportion on the light-emitting element 11 side is formed as an extension 7b extending toward the above-mentioned light-emitting element 11 inside the above-mentioned through hole 4 for light propagation so as to enable light beams L emitted from the light-emitting element 11 to enter the extension 7b, with the degree of diffusion of the light beams L held low. The extension 7b extends through the above-mentioned under cladding layer 6 to protrude upwardly from the under cladding layer 6, and has a distal end surface 7c in face-to-face relationship with a light-emitting portion 11a of the light-emitting element 11. Also, a portion of the above-mentioned core 7 near the end portion on the light-receiving element 12 side is formed as an extension 7y extending toward the above-mentioned light-receiving element 12 inside the above-mentioned through hole 4 for light propagation so as to enable the light beams L emitted from the above-mentioned light-emitting element 11 and coming through the core 7 to the light reflection portion 7a on the light-receiving element 12 side to be propagated to the above-mentioned light-receiving element 12, with the degree of diffusion of the light beams L held low. The extension 7y extends through the above-mentioned under cladding layer 6 to protrude upwardly from the under cladding layer 6, and has a distal end surface 7z in face-to-face relationship with a light-receiving portion 12a of the light-receiving element 12. The above-mentioned extensions 7b and 7y are positioned inside the above-mentioned through holes 4 for light propagation in a manner described above.

In this embodiment, the above-mentioned electric circuit board E is constructed such that the electric circuit 3 is formed on the surface of a stainless steel substrate 1, with an insulation layer 2 therebetween, and portions of this electric circuit 3 serve as mounting pads 3a for mounting the above-mentioned light-emitting element 11 and light-receiving element 12 thereon. In FIG. 1, the reference character 11b designates a bump (electrode) of the above-mentioned light-emitting element 11, and the reference character 12b designates a bump (electrode) of the light-receiving element 12.

Light propagation in the above-mentioned opto-electric hybrid module is accomplished in a manner to be described below. Specifically, the above-mentioned light-emitting element 11 is an optical element for emitting the light beams L toward the distal end surface 7c of the extension 7b on the first end side of the core 7. The light beams L emitted from the light-emitting portion 11a of the light-emitting element 11 travel into the above-mentioned through hole 4 for light propagation of the above-mentioned electric circuit board E, and enter the distal end surface 7c of the extension 7b of the above-mentioned core 7 inside the through hole 4. Next, the light beams L travel through the interior of the extension 7b on the first end side of the core 7, and thereafter are reflected from the above-mentioned light reflection portion 7a to travel rightwardly as viewed in the figure through the interior of the core 7. Then, the light beams L are propagated to the light reflection portion 7a provided in the second end portion of the core 7. Subsequently, the light beams L are reflected upwardly from the light reflection portion 7a provided in the above-mentioned second end portion, pass through the extension 7y on the second end side of the core 7, and exit from the distal end surface 7z thereof. Then, the light beams L exit the through hole 4 for light propagation of the above-mentioned electric circuit board E, and thereafter are received by the light-receiving portion 12a of the light-receiving element 12.

In the above-mentioned opto-electric hybrid module, the distance between the light-emitting portion 11a of the light-emitting element 11 and the distal end surface 7c of the extension 7b provided on the first end side of the core 7, and the distance between the light-receiving portion 12a of the light-receiving element 12 and the distal end surface 7z of the extension 7y provided on the second end side of the core 7 are short. This allows the light beams L emitted from the light-emitting portion 11a of the light-emitting element 11 to enter the distal end surface 7c of the extension 7b of the above-mentioned core 7 on the first end side of the core 7 before the light beams L are diffused too widely during the light propagation in the above-mentioned opto-electric hybrid module. This also allows the light-receiving portion 12a of the light-receiving element 12 to receive the light beams L exiting from the distal end surface 7z of the extension 7y on the second end side of the core 7 before the light beams L are diffused too widely. In this manner, the above-mentioned opto-electric hybrid module, in which the reliability of the light propagation is improved, is capable of reducing the propagation loss of the light beams.

A manufacturing method of such an opto-electric hybrid module is as follows. First, the above-mentioned electric circuit board E and the optical waveguide $W_1$ are produced individually. Then, the optical elements (the light-emitting element 11 and the light-receiving element 12) are mounted on the electric circuit 3 of the above-mentioned electric circuit board E. Thereafter, the above-mentioned electric circuit board E and the optical waveguide $W_1$ are bonded to each other with the adhesive 5. This manufacturing method of the opto-electric hybrid module will be described hereinafter in order in detail.

First, the step of producing the above-mentioned electric circuit board E will be described. In this embodiment, the above-mentioned stainless steel substrate 1 with reference to FIG. 2A) is initially prepared. A stainless steel substrate having a thickness in the range of 20 μm to 1 mm is typically used as this stainless steel substrate 1.

Figure 2A:
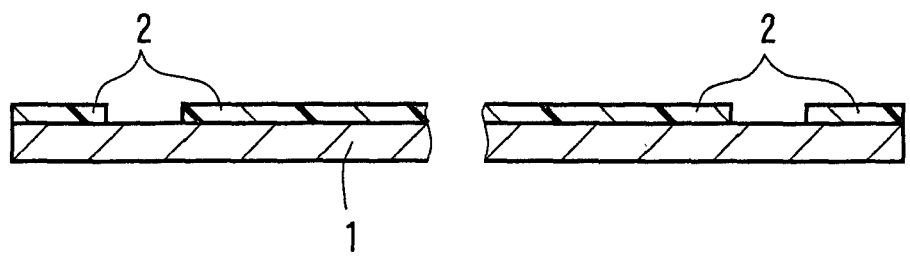
FIGS. 2A to 2C are illustrations schematically showing the steps of producing an electric circuit board in a manufacturing method of the above-mentioned opto-electric hybrid module according to the first embodiment.

Next, as shown in FIG. 2A, the insulation layer 2 having a predetermined pattern is formed by a photolithographic method in a predetermined position of the surface of the above-mentioned stainless steel substrate 1. This insulation layer 2 is formed except where the through holes 4 for light propagation are to be formed in the stainless steel substrate 1 in a subsequent step (with reference to FIG. 2C). Specifically, the formation of the above-mentioned insulation layer 2 is accomplished in a manner to be described below. First, a photosensitive resin such as a photosensitive polyimide resin, a photosensitive epoxy resin, and the like is applied to the predetermined position of the surface of the above-mentioned stainless steel substrate 1 to form a photosensitive resin layer. Next, through a photomask formed with an opening pattern corresponding to the pattern of the insulation layer 2, a portion of the above-mentioned photosensitive resin layer corresponding to the above-mentioned opening pattern is exposed to irradiation light. Next, development is performed using a developing solution to dissolve away an unexposed portion, thereby forming the remaining photosensitive resin layer into the pattern of the insulation layer 2. Thereafter, a heating treatment is performed to remove the developing solution remaining on the surface and the like of the patterned photosensitive resin layer. Thus, the above-mentioned patterned photosensitive resin layer is formed into the insulation layer 2. The thickness of the insulation layer 2 is typically in the range of 5 to 15 μm.

Figure 2B:
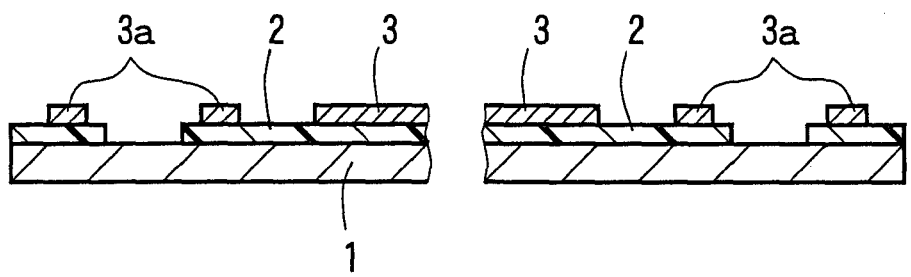

Next, as shown in FIG. 2B, the electric circuit 3 including the mounting pads 3a is formed in a predetermined pattern on the surface of the above-mentioned insulation layer 2. Specifically, the formation of this electric circuit 3 is accomplished in a manner to be described below. First, a metal layer (having a thickness on the order of 600 to 2600 Å) is initially formed on the surface of the above-mentioned insulation layer 2 by sputtering, electroless plating or the like. This metal layer becomes a seed layer (a layer serving as a basis material for the formation of an electroplated layer) for a subsequent electroplating process. Next, a dry film resist is affixed to the opposite surfaces of a laminate comprised of the above-mentioned stainless steel substrate 1, the insulation layer 2, and the metal layer (seed layer). Thereafter, groove portions in the pattern of the electric circuit 3 are formed by a photolithographic method in the dry film resist on the side where the above-mentioned metal layer is formed so that surface portions of the above-mentioned metal layer are exposed or uncovered at the bottoms of the groove portions. Next, electroplating is performed to form an electroplated layer (having a thickness on the order of 5 to 20 μm) in a stacked manner on the surface portions of the above-mentioned metal layer exposed or uncovered at the bottoms of the above-mentioned groove portions. Then, the above-mentioned dry film resist is stripped away using an aqueous sodium hydroxide solution and the like. Thereafter, a metal layer portion on which the above-mentioned electroplated layer is not formed is removed by soft etching, so that a laminate portion comprised of the remaining electroplated layer and the underlying metal layer is formed into the electric circuit 3.

Figure 2C:
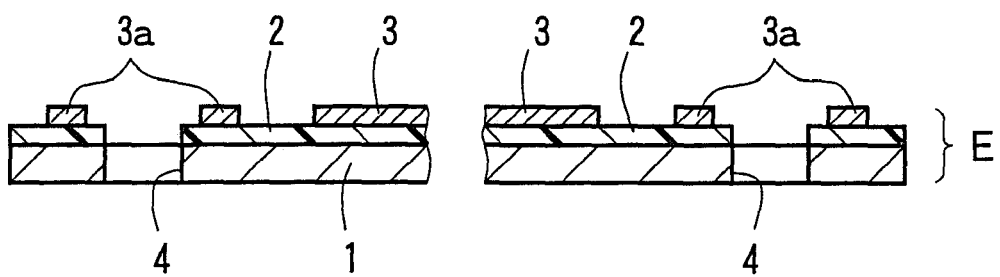

Then, as shown in FIG. 2C, the through holes 4 for light propagation are formed in predetermined positions of the stainless steel substrate 1 by etching or the like. The through holes 4 for light propagation are formed in positions (two positions) corresponding to the opposite end portions of the above-mentioned core 7. Specifically, the formation of the above-mentioned through holes 4 for light propagation is accomplished in a manner to be described below. First, a dry film resist is affixed to the opposite surfaces of a laminate comprised of the above-mentioned stainless steel substrate 1, the insulation layer 2, and the electric circuit 3. Thereafter, hole portions in the pattern of the above-mentioned through holes 4 are formed by a photolithographic method in the dry film resist on one side so that surface portions of the above-mentioned stainless steel substrate 1 are exposed or uncovered at the bottoms of the hole portions. Next, etching or the like using laser or an aqueous ferric chloride solution is performed to bore holes in the portions of the above-mentioned stainless steel substrate 1 exposed or uncovered at the bottoms of the above-mentioned hole portions, thereby forming the above-mentioned through holes 4 for light propagation. The diameter of the through holes 4 for light propagation is typically in the range of 0.05 to 0.2 mm. However, the diameter of the through holes 4 is dependent on the design of the light-emitting element 11 and the like, and hence is not always limited to within the above-mentioned range. In this manner, the step of producing the above-mentioned electric circuit board E is completed.

Figure 3A:
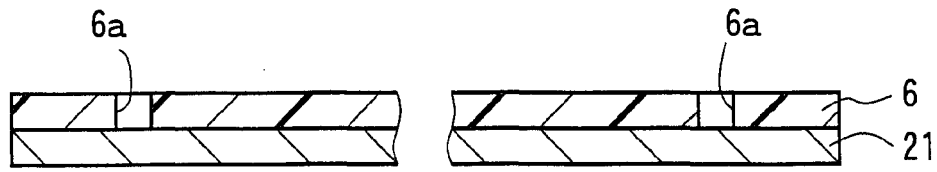
FIGS. 3A to 3E are illustrations schematically showing the steps of producing an optical waveguide in the manufacturing method of the above-mentioned opto-electric hybrid module according to the first embodiment.

Next, the step of producing the above-mentioned optical waveguide $W_1$ will be described. In this embodiment, as shown in FIG. 3A, another stainless steel substrate 21 (having a thickness in the range of 25 to 50 μm) is prepared, and the under cladding layer 6 having a predetermined pattern is formed by a photolithographic method in a predetermined position of the surface of the stainless steel substrate 21. This under cladding layer 6 is formed except portions (hole portions 6a) where the extensions 7b and 7y of the core 7 are to be formed in a subsequent step (with reference to FIG. 3E). Specifically, the formation of this under cladding layer 6 is accomplished in a manner to be described below. First, a varnish prepared by dissolving a photosensitive resin for the formation of the under cladding layer 6 such as a photosensitive polyimide resin, a photosensitive epoxy resin, and the like in a solvent is applied to the predetermined position of the surface of the above-mentioned stainless steel substrate 21. Thereafter, a heating treatment (at 50 to 120° C. for approximately 10 to 30 minutes) is performed, as required, to dry the varnish, thereby forming a photosensitive resin layer for the formation of the under cladding layer 6. Next, through a photomask formed with an opening pattern corresponding to the pattern of the under cladding layer 6, a portion of the above-mentioned photosensitive resin layer corresponding to the above-mentioned opening pattern is exposed to irradiation light. Next, development is performed using a developing solution to dissolve away an unexposed portion, thereby forming the remaining photosensitive resin layer into the pattern of the under cladding layer 6. Thereafter, a heating treatment is performed to remove the developing solution remaining on the surface and the like of the patterned photosensitive resin layer. Thus, the above-mentioned patterned photosensitive resin layer is formed into the under cladding layer 6. The thickness of this under cladding layer 6 is typically in the range of 5 to 50 μm. Also, the above-mentioned under cladding layer 6 is formed except the portions where the extensions 7b and 7y of the core 7 are to be formed in a subsequent step (with reference to FIG. 3E), as mentioned earlier. The portions are formed as the hole portions 6a, and the stainless steel substrate 21 is exposed or uncovered at the bottoms of the hole portions 6a.

Figure 3B:
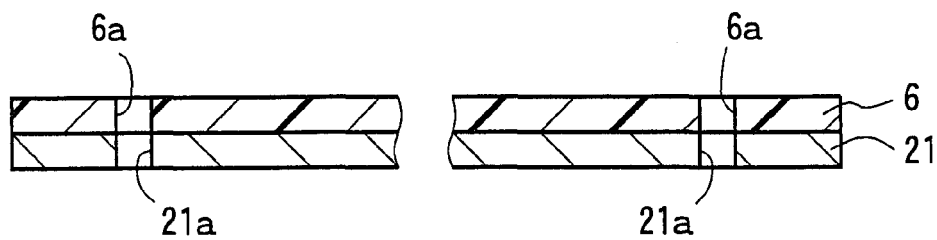

Then, as shown in FIG. 3B, etching or the like using laser or an aqueous ferric chloride solution is performed to bore holes in the portions of the above-mentioned stainless steel substrate 21 exposed or uncovered at the bottoms of the above-mentioned hole portions 6a, thereby forming through holes 21a.

Figure 3C:
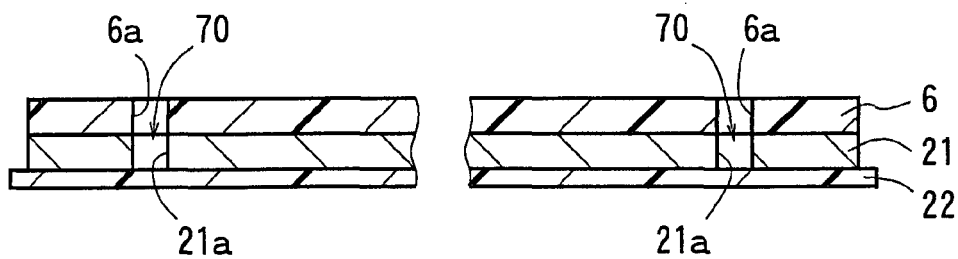

Next, as shown in FIG. 3C, a film 22 such as a polyethylene terephthalate (PET) film and the like is adhered to the opposite surface (back surface) of the above-mentioned stainless steel substrate 21 from a surface (front surface) thereof on which the under cladding layer 6 is formed. This closes and covers the openings at the bottoms of the through holes 21a formed in the above-mentioned stainless steel substrate 21 to form recessed portions 70 defined by the hole portions 6a of the above-mentioned under cladding layer 6, the through holes 21a of the above-mentioned stainless steel substrate 21, and the above-mentioned film 22.

Figure 3D:
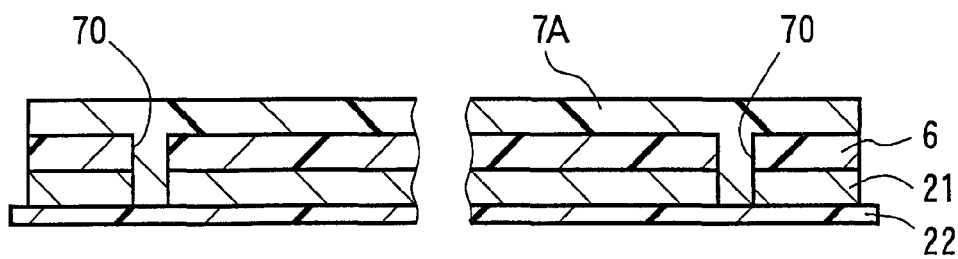
Figure 3E:
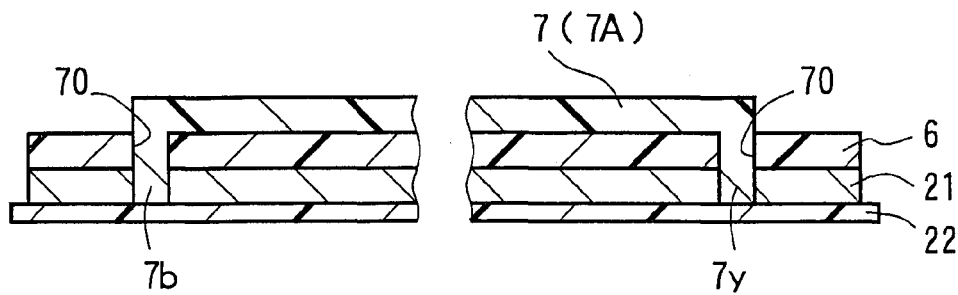

Then, as shown in FIGS. 3D and 3E, the core 7 having a predetermined pattern is formed by a photolithographic method in a predetermined position of the surface of the above-mentioned under cladding layer 6 and in the above-mentioned recessed portions 70. Specifically, the formation of this core 7 is accomplished in a manner to be described below. First, as shown in FIG. 3D, a varnish prepared by dissolving a photosensitive resin for the formation of the core 7 such as a photosensitive polyimide resin, a photosensitive epoxy resin, and the like in a solvent is applied to the surface of the above-mentioned under cladding layer 6, and also fills the above-mentioned recessed portions 70. Thereafter, a heating treatment (at 50 to 120° C. for approximately 10 to 30 minutes) is performed, as required, to dry the varnish, thereby forming a photosensitive resin layer (including portions filling the above-mentioned recessed portions 70) 7A for the formation of the core 7. Next, through a photomask formed with an opening pattern corresponding to the pattern of the core 7, a portion of the above-mentioned photosensitive resin layer 7A corresponding to the above-mentioned opening pattern is exposed to irradiation light. Next, as shown in FIG. 3E, development is performed using a developing solution to dissolve away an unexposed portion, thereby forming the remaining photosensitive resin layer 7A into the pattern of the core 7. Thereafter, a heating treatment is performed to remove the developing solution remaining on the surface and the like of the patterned photosensitive resin layer 7A. Thus, the above-mentioned patterned photosensitive resin layer 7A is formed into the core 7. This core 7 includes portions corresponding to the interior of the above-mentioned recessed portions 70, and the portions serve as the extensions 7b and 7y of the above-mentioned core 7. The above-mentioned core 7 is in the form of a rectangle in section, and the dimensions of the core 7 are typically in the range of 5 to 60 μm in vertical dimension×5 to 60 μm in horizontal dimension. It should be noted that the photosensitive resin for the formation of the above-mentioned core 7 used herein is a photosensitive resin having a refractive index greater than that of the photosensitive resin for the formation of the above-mentioned under cladding layer 6 and the over cladding layer 8 to be described below. The adjustment of this refractive index may be made, for example, by adjusting the selection of the types of the photosensitive resins for the above-mentioned under cladding layer 6, the core 7 and the over cladding layer 8, and the composition ratio thereof.

Then, as shown in FIG. 4A, the over cladding layer 8 having a predetermined pattern is formed by a photolithographic method on the surface of the above-mentioned under cladding layer 6 so as to cover the above-mentioned core 7. Specifically, the formation of this over cladding layer 8 is accomplished in a manner to be described below. First, a varnish prepared by dissolving a photosensitive resin for the formation of the over cladding layer 8 in a solvent is applied so as to cover the above-mentioned core 7. Thereafter, a heating treatment (at 50 to 120° C. for approximately 10 to 30 minutes) is performed, as required, to dry the varnish, thereby forming a photosensitive resin layer for the formation of the over cladding layer 8. Then, a photolithographic method using a photomask formed with an opening pattern corresponding to the pattern of the over cladding layer 8 is performed to form the over cladding layer 8 having the predetermined pattern. The thickness of this over cladding layer 8 is typically in the range of 10 to 2000 μm. An example of the material for the formation of the above-mentioned over cladding layer 8 used herein includes a photosensitive resin similar to that of the above-mentioned under cladding layer 6.

Next, as shown in FIG. 4B, the above-mentioned film 22 (with reference to FIG. 4A) is stripped away, and thereafter the above-mentioned stainless steel substrate 21 (with reference to FIG. 4A) is removed by etching or the like using an aqueous ferric chloride solution. This causes portions of the core 7 (distal end portions of the extensions 7b and 7y of the core 7) that have been formed inside the through holes 21a of the above-mentioned stainless steel substrate 21 to emerge so as to protrude from the under cladding layer 6. The height of protrusion of this core 7 is equal to the thickness of the above-mentioned stainless steel substrate 21. In this manner, the formation of the extensions 7b and 7y of the core 7 is a feature of the present invention.

Then, as shown in FIG. 4C, portions corresponding to the opposite end portions of the above-mentioned core 7 are formed into inclined surfaces inclined at 45 degrees to the axial direction of the above-mentioned core 7 by laser beam machining, cutting using a rotary blade and the like having an included angle of 90 degrees, and the like from the above-mentioned over cladding layer 8 side. End portions of the core 7 positioned at the inclined surfaces function as the light reflection portions (optical path conversion mirrors) 7a. At the light reflection portions 7a, the refractive index of the core 7 is greater than that of air present outside the above-mentioned light reflection portions 7a. For this reason, a majority of light beams impinging upon the light reflection portions 7a are reflected therefrom. In this manner, the step of producing the above-mentioned optical waveguide $W_1$ is completed.

Figure 5:
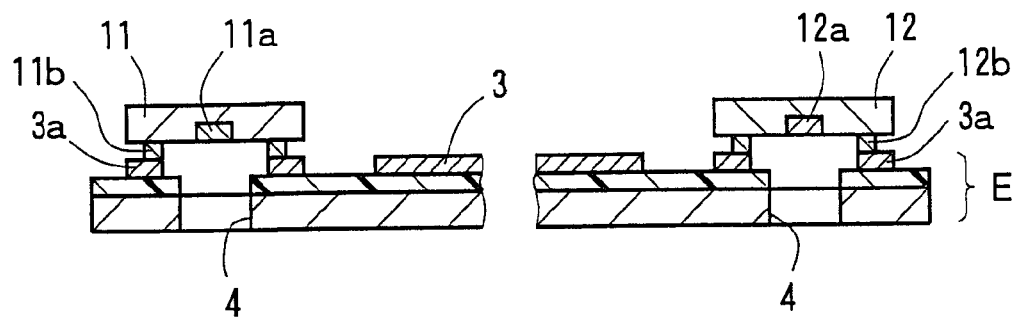
FIG. 5 is an illustration schematically showing the step of mounting optical elements subsequent to the step of producing the above-mentioned electric circuit board.

Next, the above-mentioned step of mounting the optical elements will be described. Specifically, the mounting of the optical elements (the light-emitting element 11 and the light-receiving element 12) is accomplished in a manner to be described below. First, as shown in FIG. 5, the above-mentioned electric circuit board E is set on a stage of a mounting machine, with the surface thereof on the electric circuit 3 side positioned upside. Then, one of the optical elements (for example, the light-emitting element 11) in face-to-face relationship with a region where the above-mentioned through hole 4 for light propagation on the first end side (for example, the left-hand side of FIG. 5) of the electric circuit board E is formed is mounted on the mounting pads 3a. Similarly, on the second end side (for example, the right-hand side of FIG. 5), the other optical element (for example, the light-receiving element 12) in face-to-face relationship with a region where the above-mentioned through hole 4 for light propagation is formed is mounted on the mounting pads 3a. Examples of the above-mentioned light-emitting element 11 include a VCSEL (Vertical Cavity Surface Emitting Laser) and the like. Examples of the above-mentioned light-receiving element 12 include a PD (Photo Diode) and the like. Examples of a method of mounting the above-mentioned light-emitting element 11 and light-receiving element 12 include a flip-chip method, a solder reflow method, a C4 bonding method using screen printing of solder bumps and solder paste, and the like. Of these method, the flip-chip method using ultrasonic waves and heating is preferable from the viewpoint of reducing misregistration during the mounting, and the flip-chip method using ultrasonic waves is more preferable from the viewpoint of preventing heat damages to the above-mentioned electric circuit board E. In this manner, the above-mentioned step of mounting the optical elements is completed.

Figure 6:
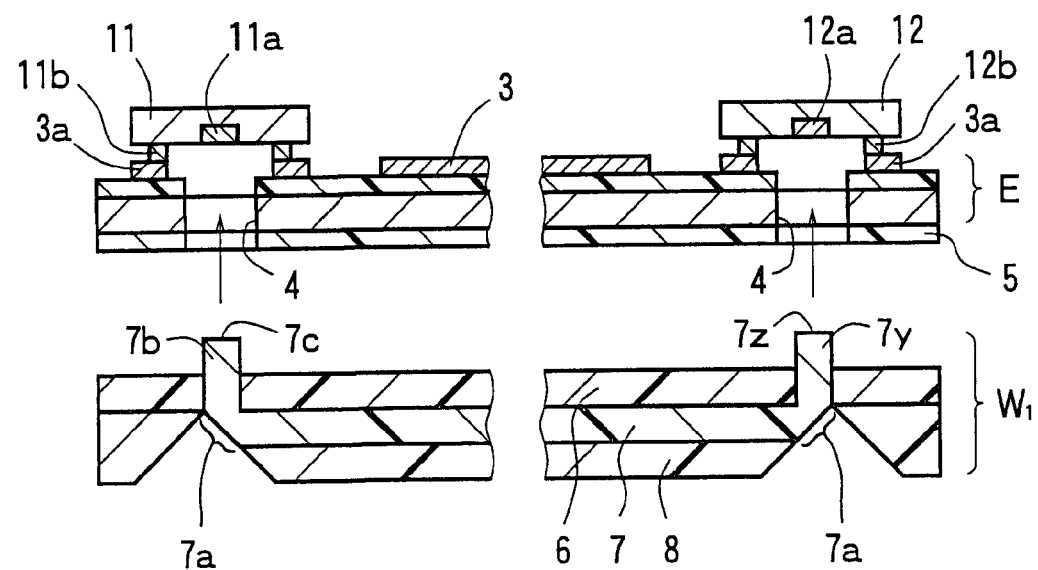
FIG. 6 is an illustration schematically showing the step of bonding the above-mentioned electric circuit board and the above-mentioned optical waveguide to each other.

Next, the step of bonding the above-mentioned electric circuit board E and the optical waveguide $W_1$ to each other will be described. Specifically, as shown in FIG. 6, after the above-mentioned step of mounting the optical elements, the adhesive 5 is applied to the opposite surface (the back surface of the stainless steel substrate 1) of the above-mentioned electric circuit board E from the surface thereof on which the electric circuit 3 is formed. Then, the extensions 7b and 7y of the core 7 of the optical waveguide $W_1$ (the optical waveguide $W_1$ of FIG. 4C is placed upside down in FIG. 6) are positioned in the through holes 4 for light propagation formed in the above-mentioned electric circuit board E from the side of the surface to which the above-mentioned adhesive 5 is applied. In this state, the under cladding layer 6 of the optical waveguide $W_1$ is bonded with the above-mentioned applied adhesive 5 to the back surface of the stainless steel substrate 1 of the above-mentioned electric circuit board E. This brings the distal end surfaces 7c and 7z of the extensions 7b and 7y of the above-mentioned core 7 into face-to-face relationship with the light-emitting portion 11a of the light-emitting element 11 and the light-receiving portion 12a of the light-receiving element 12. Positioning the optical waveguide $W_1$ relative to the above-mentioned electric circuit board E in this manner by using the extensions 7b and 7y of the core 7 after the mounting of the above-mentioned light-emitting element 11 and light-receiving element 12 is a feature of the present invention. In this manner, the step of bonding the above-mentioned electric circuit board E and the optical waveguide $W_1$ to each other is completed, and the intended opto-electric hybrid module (with reference to FIG. 1) is provided.

Figure 7:
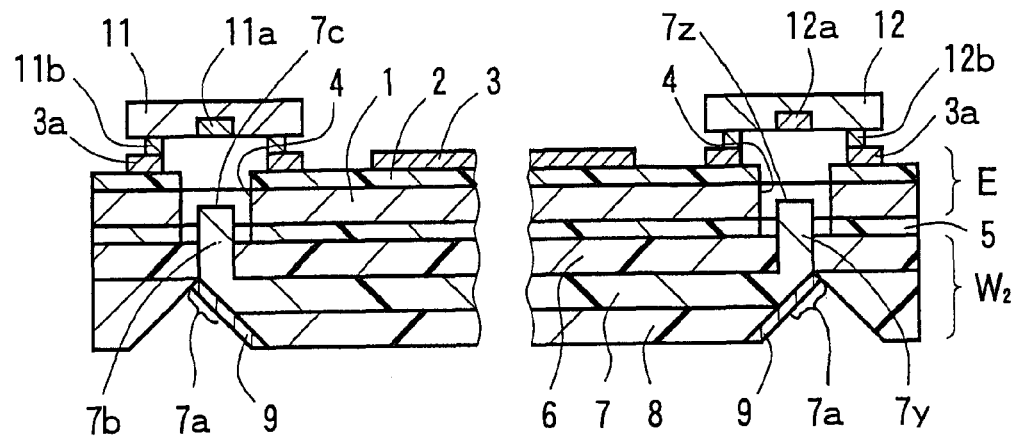
FIG. 7 is a sectional view schematically showing the opto-electric hybrid module according to a second embodiment of the present invention.

FIG. 7 shows the opto-electric hybrid module according to a second embodiment of the present invention. This embodiment differs in an optical waveguide $W_2$ from the above-mentioned first embodiment. Specifically, the optical waveguide $W_2$ according to this embodiment includes a metal film 9 formed by plating or vapor deposition on the inclined surfaces of the opposite end portions of the core 7 and the over cladding layer 8 corresponding thereto. In this optical waveguide $W_2$, the outer surfaces of the light reflection portions 7a are covered with the above-mentioned metal film 9. Thus, the light reflectance of the light reflection portions 7a is high, and the light propagation efficiency of the above-mentioned opto-electric hybrid module is accordingly high. Other parts of this embodiment are similar to those of the above-mentioned first embodiment. Like reference numerals and characters are used to designate parts similar to those of the first embodiment.

The formation of the above-mentioned metal film 9 is accomplished, for example, by the above-mentioned plating or vapor deposition, with other portions than the inclined surfaces of the opposite end portions and the like of the core 7 of the optical waveguide $W_1$ masked with a resist layer (or with only the above-mentioned inclined surfaces exposed or uncovered), after the production of the optical waveguide $W_1$ (with reference to FIG. 4C) of the above-mentioned first embodiment. Thereafter, the above-mentioned resist layer is removed, and the optical waveguide $W_2$ is produced. The thickness of the above-mentioned metal film 9 is, for example, in the range of 50 nm to 5 μm. Examples of a material for the formation of the above-mentioned metal film 9 include nickel, copper, silver, gold, chromium, aluminum, zinc, tin, cobalt, tungsten, platinum, palladium, an alloy material including at least two of these elements, and the like.

Figure 8:
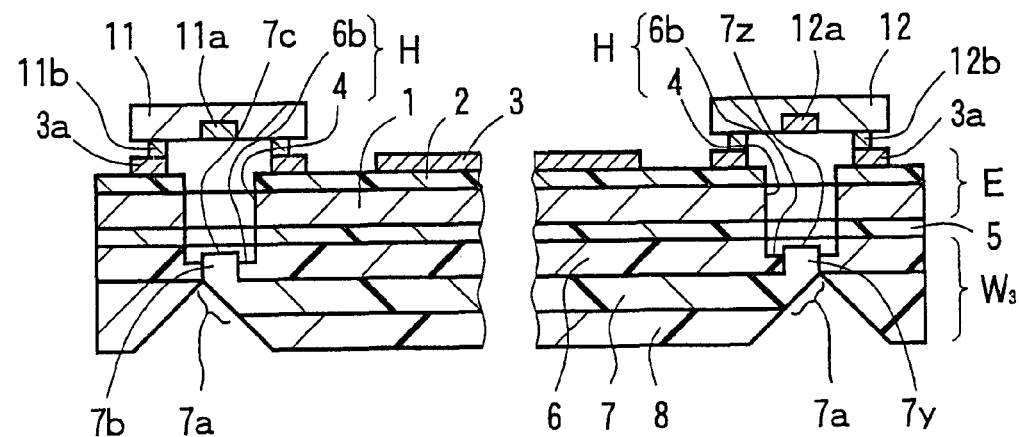
FIG. 8 is a sectional view schematically showing the opto-electric hybrid module according to a third embodiment of the present invention.

FIG. 8 shows the opto-electric hybrid module according to a third embodiment of the present invention. This embodiment differs in an optical waveguide $W_3$ from the above-mentioned first embodiment. Specifically, the optical waveguide $W_3$ according to this embodiment includes recessed portions 6b integral with the above-mentioned through holes 4 for light propagation and formed in portions of the under cladding layer 6 corresponding to the lower ends of the through holes 4 for light propagation formed in the electric circuit board E. The distal end surfaces 7c and 7z of the extensions 7b and 7y of the core 7 protrude slightly from the bottom surface of the recessed portions 6b formed in the above-mentioned under cladding layer 6. Thus, in the above-mentioned opto-electric hybrid module, the extensions 7b and 7y of the above-mentioned core 7 are provided within integrated through holes H into which the above-mentioned through holes 4 for light propagation and the recessed portions 6b formed in the above-mentioned under cladding layer 6 are integrated. In this manner, the term "through holes for light propagation" according to the present invention not only refers to the original through holes 4 for light propagation but also is meant to include the integrated through holes H comprised of the original through holes 4 for light propagation and the recessed portions 6b formed in the above-mentioned under cladding layer 6. Other parts of this embodiment are similar to those of the above-mentioned first embodiment. Like reference numerals and characters are used to designate parts similar to those of the first embodiment.

In the above-mentioned embodiments, the stainless steel substrate 1 is used for the production of the electric circuit board E. However, in place of the stainless steel substrate 1, a substrate 1 made of other metal materials, resin materials or the like may be used. When the substrate 1 has insulating properties, the electric circuit 3 may be formed directly on the above-mentioned substrate 1 without the formation of the above-mentioned insulation layer 2. The above-mentioned insulation layer 2 is provided to prevent a short circuit from occurring between the substrate 1 having electrical conductivity such as the above-mentioned metal substrate 1 and the electric circuit 3.

Also, in the above-mentioned embodiments, the stainless steel substrate 21 is used for the production of the optical waveguides $W_1$, $W_2$ and $W_3$. However, in place of the stainless steel substrate 21, a substrate 21 made of other metal materials, resin materials or the like may be used.

Although the over cladding layer 8 is formed in the above-mentioned embodiments, this over cladding layer 8 need not be formed in some instances.

Next, an inventive example of the present invention will be described in conjunction with a conventional example. It should be noted that the present invention is not limited to the inventive example.

Production of Electric Circuit Board

First, an insulation layer (having a thickness of 10 μm) made of a photosensitive polyimide resin was formed in a predetermined pattern on a surface of a stainless steel substrate (SUS 304 foil having a thickness of 20 μm) by a photolithographic method. Then, a seed layer made of copper/nickel/chromium alloy was formed on a surface of the above-mentioned insulation layer by sputtering. Next, a dry film resist was affixed to the opposite surfaces of a laminate comprised of the above-mentioned stainless steel substrate, the insulation layer, and the seed layer. Thereafter, groove portions in the pattern of an electric circuit including mounting pads were formed by a photolithographic method in the above-mentioned dry film resist on the side where the above-mentioned seed layer was formed so that surface portions of the above-mentioned seed layer were exposed or uncovered at the bottoms of the groove portions. Next, electro copper plating was performed to form an electro copper plated layer (having a thickness of 20 μm) in a stacked manner on the surface portions of the above-mentioned seed layer exposed or uncovered at the bottoms of the above-mentioned groove portions. Then, the above-mentioned dry film resist was stripped away using an aqueous sodium hydroxide solution. Thereafter, a portion of the seed layer on which the above-mentioned electro copper plated layer was not formed was removed by soft etching, so that a laminate portion comprised of the remaining electro copper plated layer and the underlying seed layer was formed into the electric circuit. Further, a dry film resist was affixed to the opposite surfaces of a laminate comprised of the above-mentioned stainless steel substrate, the insulation layer, and the electric circuit. Thereafter, hole portions in the pattern of through holes for light propagation were formed by a photolithographic method in the above-mentioned dry film resist on one side so that surface portions of the above-mentioned stainless steel substrate were exposed or uncovered at the bottoms of the hole portions. Next, etching using an aqueous ferric chloride solution was performed to bore holes in portions of the above-mentioned stainless steel substrate exposed or uncovered at the bottoms of the above-mentioned hole portions, thereby forming the two through holes for light propagation mentioned above. Thereafter, a gold/nickel alloy plated layer was formed on the surface of the above-mentioned mounting pads.

Material for Formation of Under Cladding Layer and Over Cladding Layer

A material for formation of an under cladding layer and an over cladding layer was prepared by mixing 35 parts by weight of bisphenoxyethanol fluorene glycidyl ether (component A) represented by the following general formula (I), 40 parts by weight of 3',4'-epoxycyclohexylmethyl-3,4-epoxycyclohexane carboxylate which is an alicyclic epoxy resin (CELLOXIDE 2021P manufactured by Daicel Chemical Industries, Ltd.) (Component B), 25 parts by weight of (3',4'-epoxycyclohexane)methyl-3',4'-epoxycyclohexyl-carboxylate (CELLOXIDE 2081 manufactured by Daicel Chemical Industries, Ltd.) (Component C), and 2 parts by weight of a 50% propione carbonate solution of 4,4'-bis[di(β-hydroxyethoxy)phenylsulfinio]phenyl-sulfide-bis-hexafluoroantimonate (component D).

[Production of Optical Waveguide]

A second stainless steel substrate (SUS 304 foil having a thickness of 35 μm) was prepared. The material for the formation of the above-mentioned under cladding layer was applied to a surface of the second stainless steel substrate to form a coating layer (having a thickness of 15 μm). Thereafter, the under cladding layer (having a thickness of 15 μm) formed with two hole portions (having a depth of 15 μm) having square openings (50 μm in vertical dimension×50 μm in horizontal dimension) was formed by a photolithographic method. Then, the second stainless steel substrate was exposed or uncovered at the bottoms of the hole portions.

Next, etching using an aqueous ferric chloride solution was performed to bore holes in portions of the above-mentioned second stainless steel substrate exposed or uncovered at the bottoms of the above-mentioned hole portions, thereby forming through holes. Next, a PET film with an adhesive layer was laminated to the opposite surface of the above-mentioned second stainless steel substrate from a surface thereof on which the under cladding layer was formed. This closed and covered the openings at the bottoms of the through holes formed in the above-mentioned second stainless steel substrate to form recessed portions defined by the hole portions of the above-mentioned under cladding layer, the through holes of the above-mentioned second stainless steel substrate, and the above-mentioned PET film with the adhesive layer. Then, the material for the formation of the above-mentioned core was applied (to a thickness of 50 μm) to a surface of the above-mentioned under cladding layer and also filled the above-mentioned recessed portions. Thereafter, the core (50 μm in width×50 μm in height×70 mm in length) having a predetermined pattern was formed by a photolithographic method in a predetermined position of the surface of the above-mentioned under cladding layer and in the above-mentioned recessed portions. Core portions corresponding to the interior of the above-mentioned recessed portions were extensions of the core.

Next, the material for the formation of the above-mentioned over cladding layer was applied so as to cover the above-mentioned core. Thereafter, the over cladding layer was formed by a photolithographic method so as to have a thickness of 100 μm from the surface of the above-mentioned PET film with the adhesive layer.

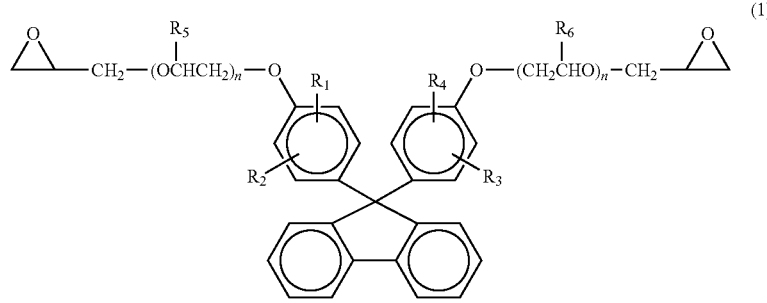

(1)

wherein $R_1$ to $R_6$ are hydrogen atoms, and n=1.

Material for Formation of Core

A material for formation of a core was prepared by dissolving 70 parts by weight of the aforementioned component A, 30 parts by weight of 1,3,3-tris{4-[2-(3-oxetanyl)]butoxyphenyl}butane and one part by weight of the aforementioned component D in ethyl lactate.

Then, the above-mentioned PET film with the adhesive layer was stripped away, and thereafter the above-mentioned second stainless steel substrate was removed by etching using an aqueous ferric chloride solution. This caused the core portions that have been formed inside the through holes of the above-mentioned second stainless steel substrate to emerge so as to protrude from the under cladding layer.

Then, portions corresponding to the opposite end portions of the above-mentioned core were formed into inclined surfaces inclined at 45 degrees to the above-mentioned second stainless steel substrate by laser beam machining using excimer laser (a KrF light source; a wavelength of 248 nm) from the above-mentioned over cladding layer side. The core portions at the inclined surfaces were light reflection portions. Thereafter, silver was deposited on the above-mentioned inclined surfaces.

Mounting of Light-Emitting Element and Light-Receiving Element

The above-mentioned electric circuit board was set on a stage of a mounting machine, with the surface thereof on the electric circuit side positioned upside. Then, a light-emitting element and a light-receiving element were mounted on the mounting pads by an ultrasonic flip-chip bonding technique. A VCSEL (850-05-1×1 manufactured by U-L-M photonics GmbH) was used as the above-mentioned light-emitting element, and a PD (TPD-8D12-014 manufactured by Roithner Lasertechnik GmbH) was used as the above-mentioned light-receiving element.

Bonding of Electric Circuit Board and Optical Waveguide

A light curable adhesive having a refractive index identical with that of the above-mentioned core was applied to the opposite surface of the electric circuit board with the above-mentioned light-emitting element and light-receiving element mounted thereon from a surface thereof on which the electric circuit was formed. Next, the extensions of the core of the optical waveguide were positioned in the through holes for light propagation formed in the above-mentioned electric circuit board. In this state, the under cladding layer of the optical waveguide was bonded with the above-mentioned applied adhesive to the back surface of the stainless steel substrate of the above-mentioned electric circuit board. In this manner, an opto-electric hybrid module was manufactured. In this opto-electric hybrid module, a distance between a light-emitting portion of the light-emitting element and a distal end surface of the extension of the core, and a distance between a light-receiving portion of the light-receiving element and a distal end surface of the extension provided on a second end side of the core were 40 μm.

CONVENTIONAL EXAMPLE

The opto-electric hybrid module in Inventive Example described above in which the extensions of the core were not formed were used as Conventional Example. In this opto-electric hybrid module, a distance between the light-emitting portion of the light-emitting element and the light reflection portion in a first end portion of the core, and a distance between the light-receiving portion of the light-receiving element and the light reflection portion in a second end portion of the core were 100 μm.

Propagation Loss of Light Beams and Coupling Loss

The propagation loss of light beams in the opto-electric hybrid module in Inventive Example and Conventional Example described above was determined in a manner to be described below. First, before the mounting of the above-mentioned VCSEL and PD, the amount of light $I_0$ emitted from the above-mentioned VCSEL itself was measured using the above-mentioned PD. Then, the above-mentioned VCSEL and PD were mounted. Thereafter, in the above-mentioned opto-electric hybrid module, the light beams emitted from the above-mentioned VCSEL were passed through the core of the above-mentioned optical waveguide, and the amount of light I received by the above-mentioned PD was measured. Then, the ratio ($I_0$/I) therebetween was calculated, and the calculated value was defined as the propagation loss of the light beams in the opto-electric hybrid module. The propagation loss of light beams in an intermediate portion of the above-mentioned optical waveguide which was determined by a cutback technique was 0.1 dB/cm. From this value and the propagation loss of the light beams in the above-mentioned opto-electric hybrid module, a coupling loss in the above-mentioned opto-electric hybrid module was calculated. The results were also shown in Table 1 below.

TABLE 1

| | Inventive Example | Conventional Example |
|---|---|---|
| Distance between Distal End Surface of Core and Optical Element (μm) | 40 | 100 |
| Propagation Loss (dB/70 mm) | 2.49 | 3.91 |
| Coupling Loss (dB) | 1.79 | 3.21 |

The above-mentioned results show that the propagation loss of the light beams and the coupling loss are reduced in Inventive Example as compared with those in Conventional Example. This is because the distance between the optical element and the distal end surface of the core in Inventive Example is smaller than that in Conventional Example.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. A method of manufacturing an opto-electric hybrid module, comprising the steps of:
   producing an electric circuit board including a through hole for light propagation formed in a predetermined region thereof;
   producing an optical waveguide including an under cladding layer, and a core having a reflection portion and an extension;
   mounting an optical element on said electric circuit board, with the optical element in-face-to-face relationship with the predetermined region of said electric circuit board; and
   bonding the under cladding layer of said optical waveguide to a surface of said electric circuit board opposite from a surface with an electric circuit formed thereon, with the extension of the core of said optical waveguide positioned in said through hole of said electric circuit board, after the mounting of said optical element.

2. The method of manufacturing the opto-electric hybrid module according to claim 1, wherein said optical element is a light-emitting element for emitting light beams toward a distal end surface of the extension of said core, and said reflection portion reflects the light beams emitted from said light-emitting element.

3. The method of manufacturing the opto-electric hybrid module according to claim 1, wherein said optical element is a light-receiving element for receiving light beams coming from a distal end surface of the extension of said core, and said reflection portion reflects light beams coming from the interior of said core.

* * * * *